(12) United States Patent
Deak

(10) Patent No.: US 7,715,228 B2
(45) Date of Patent: May 11, 2010

(54) CROSS-POINT MAGNETORESISTIVE MEMORY

(75) Inventor: James G. Deak, Eden Prairie, MN (US)

(73) Assignee: NVE Corporation, Eden Prairie, MN (US)

( * ) Notice: Subject to any disclaimer, the term of this patent is extended or adjusted under 35 U.S.C. 154(b) by 120 days.

(21) Appl. No.: 12/229,586

(22) Filed: Aug. 25, 2008

(65) Prior Publication Data

US 2010/0046282 A1  Feb. 25, 2010

(51) Int. Cl.
    *G11C 11/14* (2006.01)
(52) U.S. Cl. .................. 365/171; 365/158; 365/184; 365/157; 365/189.09
(58) Field of Classification Search .......... 365/171, 365/158, 184, 157, 189.09
    See application file for complete search history.

(56) References Cited

U.S. PATENT DOCUMENTS

| | | | |
|---|---|---|---|
| 5,991,193 A | | 11/1999 | Gallagher et al. |
| 6,538,921 B2 * | | 3/2003 | Daughton et al. ........... 365/171 |
| 6,744,086 B2 | | 6/2004 | Daughton et al. |
| 6,807,087 B2 | | 10/2004 | Deak |
| 7,230,844 B2 | | 6/2007 | Deak |
| 2004/0075152 A1 | | 4/2004 | Barna et al. |
| 2004/0114413 A1 | | 6/2004 | Parkinson et al. |
| 2007/0121364 A1 | | 5/2007 | Bertin et al. |
| 2007/0206407 A1 | | 9/2007 | Johnson |

OTHER PUBLICATIONS

Official Search Report and Written Opinion of the International Searching Authority in counterpart foreign Application No. PCT/US09/04670 filed Aug. 14, 2009.
Zhu et al. "Ultrahigh density vertical magnetoresistive random access memory." In Symposium on Magnetic Technology for a Single Chip Computer, vol. 87, No. 9, published May 1, 2000.

* cited by examiner

*Primary Examiner*—Thong Q Le
(74) *Attorney, Agent, or Firm*—Kinney & Lange, P.A.

(57) ABSTRACT

A ferromagnetic thin-film based digital memory system having memory cells interconnected in a grid that are selected through voltage values supplied coincidently on interconnections made thereto for changing states thereof and determining present states thereof through suitable biasing of grid interconnections.

26 Claims, 6 Drawing Sheets

CROSS-POINT MAGNETORESISTIVE MEMORY

STATEMENT OF GOVERNMENT INTEREST

This invention was made with Government support under HQ0006-06-C-7520 awarded by the Missile Defense Agency. The Government has certain rights in the invention.

BACKGROUND

Many kinds of electronic systems make use of magnetic devices including both digital systems, such as memories, and analog systems such as magnetic field sensors. Digital data memories are used extensively in digital systems of many kinds including computers and computer systems components, and digital signal processing systems. Such memories can be advantageously based on the storage of digital symbols as alternative states of magnetization in magnetic materials provided in each memory storage cell, the result being memories which use less electrical power and do not lose information upon removals of such electrical power.

Such memory cells, and magnetic field sensors also, can often be advantageously fabricated using ferromagnetic thin-film materials, and are often based on magnetoresistive sensing of magnetic states, or magnetic conditions, therein. Such devices may be provided at a surface of a monolithic integrated circuit to provide convenient electrical interconnections between the device and the operating circuitry therefor.

Ferromagnetic thin-film memory cells, for instance, can be made very small and packed very closely together to achieve a significant density of information storage, particularly when so provided on the surface of a monolithic integrated circuit. In this situation, the magnetic environment can become quite complex with fields in any one memory cell affecting the film portions in neighboring memory cells. Also, small ferromagnetic film portions in a memory cell can lead to substantial demagnetization fields which can cause instabilities in the magnetization state desired in such a cell.

These magnetic effects between neighbors in an array of closely packed ferromagnetic thin-film memory cells can be ameliorated to a considerable extent by providing a memory cell based on an intermediate separating material having two major surfaces on each of which an anisotropic ferromagnetic memory thin-film is provided. Such an arrangement provides significant "flux closure," i.e. a more closely confined magnetic flux path, to thereby confine the magnetic field arising in the cell to affecting primarily just that cell. This result is considerably enhanced by choosing the separating material in the ferromagnetic thin-film memory cells to each be sufficiently thin. Similar "sandwich" structures are also used in magnetic sensors.

In the recent past, reducing the thicknesses of the ferromagnetic thin-films and the intermediate layers in extended "sandwich" structures, and adding possibly alternating ones of such films and layers, i.e. superlattices, have been shown to lead to a "giant magnetoresistive effect" being present in some circumstances. This effect yields a magnetoresistive response which can be in the range of up to an order of magnitude or more greater than that due to the well known anisotropic magnetoresistive response.

A memory cell based on the "giant magnetoresistive effect" can be provided by having one of the ferromagnetic layers in the "sandwich" construction being prevented from switching the magnetization direction therein from pointing along the easy axis therein in one to the opposite direction in the presence of suitable externally applied magnetic fields while permitting the remaining ferromagnetic layer to be free to do so in the same externally applied fields. In one such arrangement, a "spin-valve" structure is formed by providing an antiferromagnetic layer on the ferromagnetic layer that is to be prevented from switching in the externally applied fields to "pin" its magnetization direction in a selected direction. In an alternative arrangement often termed a "pseudo-spin valve" structure, the ferromagnetic layer that is to be prevented from switching in the externally applied fields is made sufficiently thicker than the free ferromagnetic layer so that it does not switch in those external fields provided to switch the free layer.

An alternative digital data bit storage and retrieval memory cell suited for fabrication with submicron dimensions can be fabricated that provides rapid retrievals of bit data stored therein and low power dissipation by substituting an electrical insulator for a conductor in the nonmagnetic layer. This memory cell can be fabricated using ferromagnetic thin-film materials of similar or different kinds in each of the magnetic memory films used in a "sandwich" structure on either side of an intermediate nonmagnetic layer which ferromagnetic films may be composite films, but this intermediate nonmagnetic layer conducts electrical current therethrough based primarily on a quantum electrodynamic effect "tunneling" current, or spin dependent tunneling.

Operating magnetic fields imposed externally are typically used to vary the angle of the magnetization vector with respect to the easy axis in the ferromagnetic films of these various kinds of magnetoresistive memory cell devices, particularly the free layers. Such operational magnetic fields imposed externally can be used to vary the angle to such an extent as to cause switching of the layer magnetization vector between two stable states which occur for the magnetization being oriented in opposite directions along the easy axis of the layer, the state of the cell determining the value of the binary bit being stored therein. One of the difficulties in such memories is the need to provide memory cells therein that have sufficiently uniform switching thresholds and adequate resistance to unavoidable interjected magnetic field disturbances in the typical memory cell state selection scheme used. This externally applied operating fields scheme is based on selective externally imposed magnetic fields provided by selectively directing electrical currents over or through sequences of such cells along corresponding electrical conductors so that selection of a cell occurs through providing coincident currents through two spatially crossing conductors (at a cross-point) to provide coincident presences of such fields at that cell. Such a coincident interjected magnetic fields memory cell state selection scheme is very desirable in that an individual switch, such as that provided by a transistor, is not needed for every memory cell, but the limitations this selection mode imposes on the uniformity of switching thresholds for each memory cell in a memory make the production of high yields difficult.

There is a further difficulty with such an externally applied coincident operating fields scheme memory in which a switch such as a transistor is not used with each cell. In those of such memories that have each spatially crossing pair of conductors electrically about but not connected to its corresponding cell at the cross-point, the unselected cells passed over by these conductors have half the magnetic field needed for switching the current magnetic state of the cell to another state. This increases the possibility of such cells being switched by the occurrence of random "noise" events with such a start toward switching being provided. Because of use of sensing currents that have a relatively small magnitude, this is not usually a problem during cell magnetic state determination processes.

In those of such memories that have each spatially crossing pair of conductors electrically connected to its corresponding cell, however, the resulting arrays of spatially crossing electrical conductors connected to the array of cells also leads to alternative electrical current paths occurring in those memories in addition to the desired current path through a selected one of those cells. The resulting voltage drops from these alternative path electrical currents that then occur over the various other cells of the array, in addition to the voltage drop across the selected cell, can result in making the determination of, or the setting of, a magnetic state in the selected cell either haphazardly correct or incorrect, or even impossible to determine. Thus, a cell switch being provided for each memory cell has often been required to make the operation thereof as a data memory acceptable, but the provision of such a switch for each cell adds to the area of each cell taken in the surface area of the integrated circuit chip in which the cell is provided which thereby reduces cell areal density and so increases memory chip cost.

There is another kind of magnetoresistive memory cell devices which can have the angle of the magnetization vector of the ferromagnetic films forming their the free layers varied with respect to the easy axis in those films without use of externally imposed operating magnetic fields. These devices are also multiple layer "sandwich" structure magnetoresistive memory cells but are switched between the magnetic states of such memory cells through selecting a particular cell and then controlling the supply of spin polarized electrical currents established therethrough, using switching transistors, to maintain or reverse the magnetization direction of a soft magnetic material layer in the cell device, and this is accomplished in the absence of any externally applied magnetic fields coincident therewith.

A spin polarized electrical current has therein electrons flowing with their spins aligned in one direction predominating the number of electrons therein with spins aligned in the opposite direction. Such spin injection currents with the spins of electrons therein predominating in one direction or the other lead to a corresponding spin injection torque on the device magnetic material free layer magnetization, if oriented in the opposing direction, that is sufficient to reverse the direction thereof as a device magnetic state change, and such currents can be reduced in magnitude if the device is such that they also cause substantial heating of the switched device. Such spin current switched magnetoresistive device memory cells thus avoid the need of providing adjacent thereto electrical current conductors with which to generate magnetic fields thereabout for operating those devices. The magnetic state of a device is determined by passing a much smaller sensing current through the device as the basis of determining its electrical resistance with one of two alternative resistance values indicating which one of the two corresponding alternative magnetic states the device is currently in.

Each of the spin current switched magnetoresistive devices in such memory cells has a vertical stacked structure supported on a silicon substrate, for example, as representatively shown in the cross section side view layer diagram in FIG. 1 of such cell devices, 10, though with many of the structural portions shown there having been reduced or exaggerated in that view for purposes of clarity. Devices 10, as supported, are otherwise surrounded by an electrical insulating material, typically silicon dioxide or silicon nitride, except for the row and column interconnection conductors connected thereto. FIG. 2 provides a perspective view of a portion of a monolithic integrated circuit of a cross-point magnetoresistive memory having therein an array of such spin current switched magnetoresistive device memory cell devices 10 with respect to which the foregoing cell selection, and the cell state setting and state determination processes are to be used.

A pair of 50 Å thick ferromagnetic layers, 11 and 12, have a 9 Å thick ruthenium layer, 13, provided therebetween to form data bit storage layers. On the other side of ferromagnetic layer 12 directly supporting that layer is a 4 Å thick layer of copper, 14, as an electron spin scattering layer, and directly on the other side of ferromagnetic layer 11 is a 4 Å thick aluminum oxide baffler layer, 15. Another 50 Å thick ferromagnetic layer, 16, directly supporting scattering layer 14 is a fixed magnetization direction layer as part of a synthetic antiferromagnet. A similar 50 Å thick ferromagnetic layer, 17, directly on barrier layer 15, completes a magnetic tunnel junction with barrier layer 15 between ferromagnetic layers 11 and 17, and also forms a fixed magnetization direction layer as part of a synthetic antiferromagnet.

A 9 Å thick ruthenium layer, 18, as an antiparallel coupling and electron spin scattering layer, is provided directly supporting ferromagnetic layer 16, and another 9 Å thick ruthenium layer, 19, again as an antiparallel coupling and electron spin scattering layer, is provided directly on ferromagnetic layer 17. A ferromagnetic layer, 20, as part of the synthetic antiferromagnet formed with layers 16 and 18 in being coupled by layer 18 antiparallel to layer 16, is provided directly supporting ruthenium layer 18, and a further ferromagnetic layer, 21, as part of the synthetic antiferromagnet formed with layers 17 and 19 in being coupled antiparallel by layer 19 to layer 17, is provided directly on ruthenium layer 19. A chrome platinum manganese antiferromagnetic layer, 22, directly supports ferromagnetic layer 20 to complete the formation of the pinned synthetic antiferromagnet to pin the magnetization direction of ferromagnetic layer 16 in a selected direction. Similarly, a chrome platinum antiferromagnetic layer, 23, is directly on ferromagnetic layer 21 to complete the formation of the pinned synthetic antiferromagnet to pin the magnetization direction of ferromagnetic layer 17 in the same direction as that of ferromagnetic layer 16 along the length of the cell.

A tungsten plug, 24, extending through an electrical insulating layer directly supports and electrically contacts antiferromagnetic layer 22, and an aluminum cap, 25, is directly supported on chrome platinum antiferromagnetic layer 23. A lower electrical interconnection, 26, a column interconnection conductor, is in electrical contact with plug 24, and a further electrical interconnection, 27, a row interconnection conductor, is in electrical contact with cap 25. The cell array portion shown in FIG. 2 shows a few of row interconnection conductors 27 and column interconnection conductors 26 as they interconnect cells 10 therebetween.

Consider a current being passed through the barrier junction such that the electrons pass from top to bottom in FIG. 1. Polarized electrons tunneling from the upper pinned polarization layer 17 through adjacent barrier layer 15 and into storage ferromagnetic layer 11 will create a torque on the magnetization of layer 11. If the current density and polarization are large enough, the magnetization will rotate to be in the same direction as the magnetization of upper polarization layer 17. As the electrons flow on through inner ruthenium layer 13 to ferromagnetic layer 12, the spins of those electrons are randomized. The tight antiferromagnetic exchange coupling of the two ferromagnetic layers will ensure that the other inner magnetization layer 12 will have its magnetization direction remain antiparallel to the direction of magnetization of layer 11 to form a first magnetic state. Reversing the current will reverse the storage of data on inner magnetic layers 11 and 12 by reversing the orientations of the magnetizations of those two layers to form an alternative second magnetic state.

Retrieving stored information is accomplished by injecting smaller currents (less in magnitude than the current threshold needed for ferromagnetic layer magnetization switching) into each of the outside contacts, and taking both currents out through the storage layers. Observing the voltage difference between the outside electrodes with respect to the inner electrode, which is essentially the voltage drop across the barrier junction, will provide the output signal to indicate the storage state as the barrier junction will be in either its higher magnetoresistance magnetic state or its other in its lower magnetoresistance magnetic state. A logic "one" assigned to one of these magnetic states and a logic "zero" assigned to the other magnetic state will provide corresponding output signals which are of opposite algebraic signs.

A small shape anisotropy for the cell of 40 Oe would require that the current density for switching to be 106 A/cm2. This would require 1.0 mA into a junction of 0.1 square micron area (10-9 cm2). At 100 mV across each junction, the resistance of the junction would have to be 100 Ohm, which is equivalent to 1.0 Ohm-micron2 contact resistance.

Thus, this memory cell can have the magnetization directions of the data storage layers 11 and 12 switched by a fairly low spin injected current of 1 mA, and the output signal, using 0.1 mA to read, would be about 8 mV across the cell for a 40% magnetoresistance. The cell would have a relatively small surface area parallel to the adjacent substrate surface.

However, the need for switching transistors to control the supply of spin polarized electrical currents through the magnetoresistive devices in these cells, as is needed to switch the cells between their alternative magnetic states so as to operate them as memory cells, and also to control the provision of magnetic state sensing currents therethrough, again consumes chip surface area in the integrated circuit chips in which they are provided to result in increasing the costs thereof. A memory cell array biasing technique, however, has been found that allows determining the magnetic state of a spin current switched magnetoresistive device memory cell in the array through establishing a sensing electrical current through that cell, and also electrically biasing other cells, all without needing a switching transistor in the cell to control the sensing current to accomplish this result.

The method proceeds by providing an electrical current for sensing the current cell magnetic state through the magnetoresistive device in a selected cell in the array of cells that goes to ground through that one of the column interconnection conductors of the array to which the selected cell in the array is connected as a result of a part of a switching process used for selecting cells that are to have their magnetic states sensed. This part of the cell selecting process is accomplished through selecting to switch that column interconnection conductor connected to the selected cell to the ground voltage potential by a switch external to the array. This sensing current is supplied from a voltage source external to the array through that one of the row interconnection conductors of the array to which the selected cell is also connected as another part of the switching process used for selecting a cell to have its magnetic state sensed. This part of the process is accomplished through selecting to switch that row connected to the selected cell to a row selection voltage potential of a magnitude, generally, equal approximately to the desired sensing current multiplied by the average resistance value of the array cell magnetoresistive devices.

The remaining row interconnection conductors of the array, other than the one switched to the row selection voltage as described above, are left open with respect to external circuit portions in being unconnected to any voltage potential source. The remaining column interconnection conductors, other than the one switched to ground as described above, are switched to voltage potentials with magnitudes equal to that of the row selection voltage potential which results in all the current established in the row interconnection conductor switched to the row selection voltage passing through the selected cell. Thus, the row selection voltage potential can be chosen to have a magnitude sufficient to provide a detectable voltage difference across the selected cell that results from the different sensing current magnitudes that are established through the magnetoresistive device in the cell in the two alternative magnetic states to which this cell device can be set (through switching sufficient spin currents into it exceeding the cell switching threshold) because of the cell resistance difference between these two states.

Further, the resulting, though unwanted, alternative path currents that are also established through other cells in the array in unavoidably having such currents accompany the provision of such a sensing current with magnitudes equal to a fraction of the magnitude of the sensing current in those cells connected to no more than of either a selected row or column interconnection. These magnitude differences assure that the magnetic states of the magnetoresistive devices in the other cells remain unchanged during the retrieving of the current magnetic state of the magnetoresistive device in that selected memory cell if the selected value of the sensing current is chosen small enough to avoid such a state change in the magnetoresistive device of the selected cell in being sufficiently less than the switching threshold current value.

An approximate demonstration of the electrical currents occurring in the various cells, during the foregoing selected cell magnetic state retrieval biasing process, can be provided for such interconnected cells provided in a voltage biased cross-point cell array in which the memory cells are interconnected to row and column interconnection conductors as described above. The demonstration is based on assuming the magnetoresistive devices in the cells each have a resistance that varies relatively little from the devices average resistance R, and that the resistances of the row interconnection conductors that are connected to the common sides of the corresponding rows of cell devices and of the column interconnection conductors connected to the common opposite sides of corresponding columns of cell devices are all negligible.

In an array of spin current switched magnetoresistive device memory cells having m rows and n columns, the electrical current $I_{ij}$ in each device during steady state conditions in this selected cell magnetic state retrieval biasing process can be represented as the voltage drop across the resistance R of that cell equal to the difference between the voltage $V_{ri}$ of the row interconnection conductor to which it is connected and the voltage $V_{cj}$ of the column interconnection conductor to which it is connected with $1 \leq i \leq m$ and $1 \leq j \leq n$. This can be expressed as a matrix array of such currents and voltages of $$\begin{pmatrix} I_{11} & I_{12} & \ldots & I_{1n} \\ I_{21} & I_{21} & \ldots & I_{2n} \\ \ldots & \ldots & & \ldots \\ I_{m1} & I_{m1} & \ldots & I_{mn} \end{pmatrix} = \quad (1)$$

$$\frac{1}{R} \left\{ \begin{pmatrix} V_{r1} & V_{r1} & \ldots & V_{r1} \\ V_{r2} & V_{r2} & \ldots & V_{r2} \\ \ldots & \ldots & & \ldots \\ V_{rm} & V_{rm} & \ldots & V_{rm} \end{pmatrix} - \begin{pmatrix} V_{c1} & V_{c2} & \ldots & V_{cn} \\ V_{c1} & V_{c2} & \ldots & V_{cn} \\ \ldots & \ldots & & \ldots \\ V_{c1} & V_{c2} & \ldots & V_{cn} \end{pmatrix} \right\}$$

As indicated above, selecting a cell from which to retrieve the current magnetic state thereof through passing a sensing current therethrough involves at a minimum setting its row interconnection conductor to an externally supplied row selection voltage potential of value V (as a representative value, for example) and the column interconnection conductor thereof to ground potential. If this row interconnection conductor is so selected by applying such a row selection voltage thereto, and the corresponding column interconnection is so selected by connecting it to ground potential, then by symmetry, the unselected columns must all have the same voltage, $V_c$, and the unselected rows must all have the same voltage $V_r$. This must be true because all unselected rows are identical to each other, and all unselected columns are identical to each other. The electrical currents in the row to which the row selection voltage V is applied will carry the resulting sensing current $I_s$ and n−1 half selected currents $I_{1/2r}$, and the electrical currents received in the column switched to ground potential will be the sense current $I_s$ and m−1 half selected currents $I_{1/2c}$. The devices in the remaining rows and columns will all have by symmetry the same value of unselected current $I_u$ passing through them.

Assume, for example, that the first cell in the first row has been selected by the supplying of the row selection voltage to the first row and the column grounding to the first column to thereby have a resulting sensing current $I_s$, established therein, then the following correspondingly modified matrix arrays result:

$$\begin{pmatrix} I_s & I_{1/2r} & \cdots & I_{1/2r} \\ I_{1/2c} & I_u & \cdots & I_u \\ \cdots & \cdots & & \cdots \\ I_{1/2c} & I_u & \cdots & I_u \end{pmatrix} = \frac{1}{R} \left\{ \begin{pmatrix} V & V & \cdots & V \\ V_r & V_r & \cdots & V_r \\ \cdots & \cdots & & \cdots \\ V_r & V_r & \cdots & V_r \end{pmatrix} - \begin{pmatrix} 0 & V_c & \cdots & V_c \\ 0 & V_c & \cdots & V_c \\ \cdots & \cdots & & \cdots \\ 0 & V_c & \cdots & V_c \end{pmatrix} \right\} \quad (2)$$

The corresponding array magnetoresistive device currents from this last matrix array can then be seen to be Selected: $I_s = V/R$          (3a)

Half-selected Row: $I_{1/2r} = (V - V_c)/R$          (3b)

Half-selected Column: $I_{1/2c} = V_r/R$          (3c)

Unselected: $I_u = (V_r - V_c)/R$          (3d)

If the row and column interconnections are left without any external bias voltages applied to them, the common voltages of unselected columns $V_c$ and the voltages of the unselected rows $V_r$ can be found through equating the currents in an unselected row interconnection and equating the currents in an unselected column interconnection in accord in each instance with Kirchoff's current conservation law (current into a conductor is equal to current exiting a conductor). That is, sum the currents in an unselected row interconnection conductor of magnetoresistive devices of which one will be connected to a selected column interconnection set to a zero voltage value, or $$\frac{V_r}{R} + \frac{(N-1) \cdot (V_r - V_c)}{R} = 0 \quad (4)$$

and sum the currents in an unselected column interconnection conductor of which one will be connected to a selected row interconnection that is set to the row selection voltage value V, or $$\frac{V - V_c}{R} + \frac{(M-1) \cdot (V_r - V_c)}{R} = 0 \quad (5)$$

Solving these equations for Vr and Vc yields

Selected:          (6a)
$$I_s = V/R$$

Half-selected Row:          (6b)
$$I_{1/2r} = \left(\frac{m-1}{n+m-1}\right)\frac{V}{R}$$

Half-selected Column:          (6c)
$$I_{1/2c} = \left(\frac{n-1}{n+m-1}\right)\frac{V}{R}$$

Unselected:          (6d)
$$I_u = \left(\frac{-1}{n+m-1}\right)\frac{V}{R}$$

The equivalent resistance of the array is useful for determining the total current flowing into the array from the row selection voltage source as $I_{tot-in} = V/R_{eq}$, that is, $R_{eq}$ equals the row selection voltage value V divided by the input current into the row interconnection conductor selected in the cell selection process, i.e. V divided by the sensing current $I_s$ and the other n−1 half selected currents $I_{1/2r}$ in that row to give $$R_{eq} = \left(\frac{n+m-1}{nm}\right)R \quad (7)$$

as the array total equivalent resistance.

In the array voltage biasing arrangement described above for determining the magnetic state of a selected cell in the array thereof, the row interconnection conductor connected to the selected cell is switched to a row selection voltage potential and the remaining row interconnection conductors of the array are left open with respect to external circuit portions in being unconnected to any voltage potential source. Also, the column interconnection conductor connected to the selected cell is switched to ground and the remaining column interconnection conductors are switched to voltage potentials with magnitudes equal to that of the row selection voltage potential. This arrangement is indicated in the circuit schematic representation thereof shown in FIG. 3 for an example memory cell array having m rows of cells with the cells in each row each connected at the terminals on one side thereof to a common row interconnection conductor and connected at the terminals on the other side thereof to a corresponding one of n column interconnection conductors. Each cell has a two terminal spin current switched magnetoresistive device element therein represented as having an average electrical circuit resistance value between those terminals of R.

Since there is no voltage drop across the other cells connected to the same row interconnection conductor as is the selected cell since the row and the columns for the other cells are all connected to voltage sources of potential V, only the selected cell connected between that the row interconnection conductor (and to which row selection voltage potential V is connected) and a grounded column interconnection conductor has an electrical current through it. This situation forces that current in the selected cell to equal the row selection voltage potential V less the ground potential of zero divided by the resistance of selected cell, and so will equal the current supplied from the source of the row selection voltage. Hence, the actual resistance corresponding to the magnetic state that the selected cell is in will set the current supplied by the source of the row selection voltage, and so detecting the magnitude of that current at the source of the row selection voltage will reveal the present resistance of, and so the present magnetic state of, the selected cell.

Again, the unselected rows voltages $V_r$ can be found through equating the currents in an unselected row interconnection conductor in accord with Kirchoff's current conservation law. That is, sum the currents in the cell magnetoresistive devices connected to an unselected row interconnection conductor of which one will be connected to a selected column interconnection conductor set to a zero voltage value, and with the rest connected to voltage sources providing a voltage potential V, or $$\frac{V_r}{R} + \frac{(N-1)\cdot(V_r - V)}{R} = 0 \quad (8)$$

Solving this equation for Vr and using the column biasing potentials gives

Selected: (9a)
$$I_s = V/R$$

Half-selected Column (9b)
$$I_{1/2c} = \left(\frac{n-1}{n}\right)\frac{V}{R}$$

Unselected: (9c)
$$I_{1/2r} = \left(\frac{-1}{n}\right)\frac{V}{R}$$

These results are in accord with the foregoing description for sensing magnetic states of selected cells in an array of spin current switched magnetoresistive device memory cells, and so the magnetic states of such memory cells can be determined accurately and without changing the magnetic states of unselected cells all without a transistor switch being provided for each cell in the array. However, such a transistor switch for each cell cannot be eliminated unless also selected magnetic states can established in selected cells without needing such cell transistor switches. Thus, there is a desire for an arrangement that also allows establishing magnetic states in selected ones of such cells without needing such individual cell switches.

SUMMARY

The present invention provides a ferromagnetic thin-film based digital memory system having memory cells selected through voltage values supplied coincidently on interconnections made thereto having a plurality of bit structures each supported on a substrate and separated from one another by spacer material therebetween with each bit structure being capable of being switched between alternative electrical resistance states by switching voltages having magnitudes exceeding switching voltage thresholds thereof and that are selectively applied between first and second ends of the bit structures so as to provide suitable polarity thereacross, and each bit structure being capable of having a current electrical resistance state thereof determined by measurement voltages of magnitudes less than the switching voltage thresholds and that are selectively applied between the first and second ends thereof. There are a plurality of word line structures each having a pair of word line end terminal regions adapted to conduct electrical current therethrough with each of the pairs of word line end terminal regions having an electrical conductor connected therebetween which is electrically connected to each first end of those of the plurality of bit structures that are in a corresponding one of a plurality of word line fractions of those plurality of bit structures. There are also a plurality of bit line structures each having a pair of bit line end terminal regions adapted to conduct electrical current therethrough with each of the pairs of bit line end terminal regions having an electrical conductor connected therebetween which is electrically connected to each second end of those of the plurality of bit structures that are in a corresponding one of a plurality of bit line fractions of the plurality of bit structures, and with there being a bit structure from each of the plurality of word line fractions in each bit line fraction.

A switching system, suited for electrical connection to a source of voltage, is selectively electrically connected to each of the word line and bit line end terminal regions, this switching system being capable of selectively providing at selected state change ones of the word line and bit line end terminal regions the switching voltages of selected polarities, and further capable of providing reference voltages at selected word line and bit line end terminal regions other than the selected state change ones thereof having magnitudes that are selected multiples or fractions, or both, of the magnitudes of the switching voltages. The switching system can alternatively provide measurement and activation voltages on suitable ones of the word line and bit line end terminal regions for determining current resistance states of the plurality of bit structures. In addition, the present invention provides a method of providing voltages to the word line and bit line end terminal regions for changing, and for determining current, resistance states of the plurality of bit structures.

DETAILED DESCRIPTION

Figure 1:
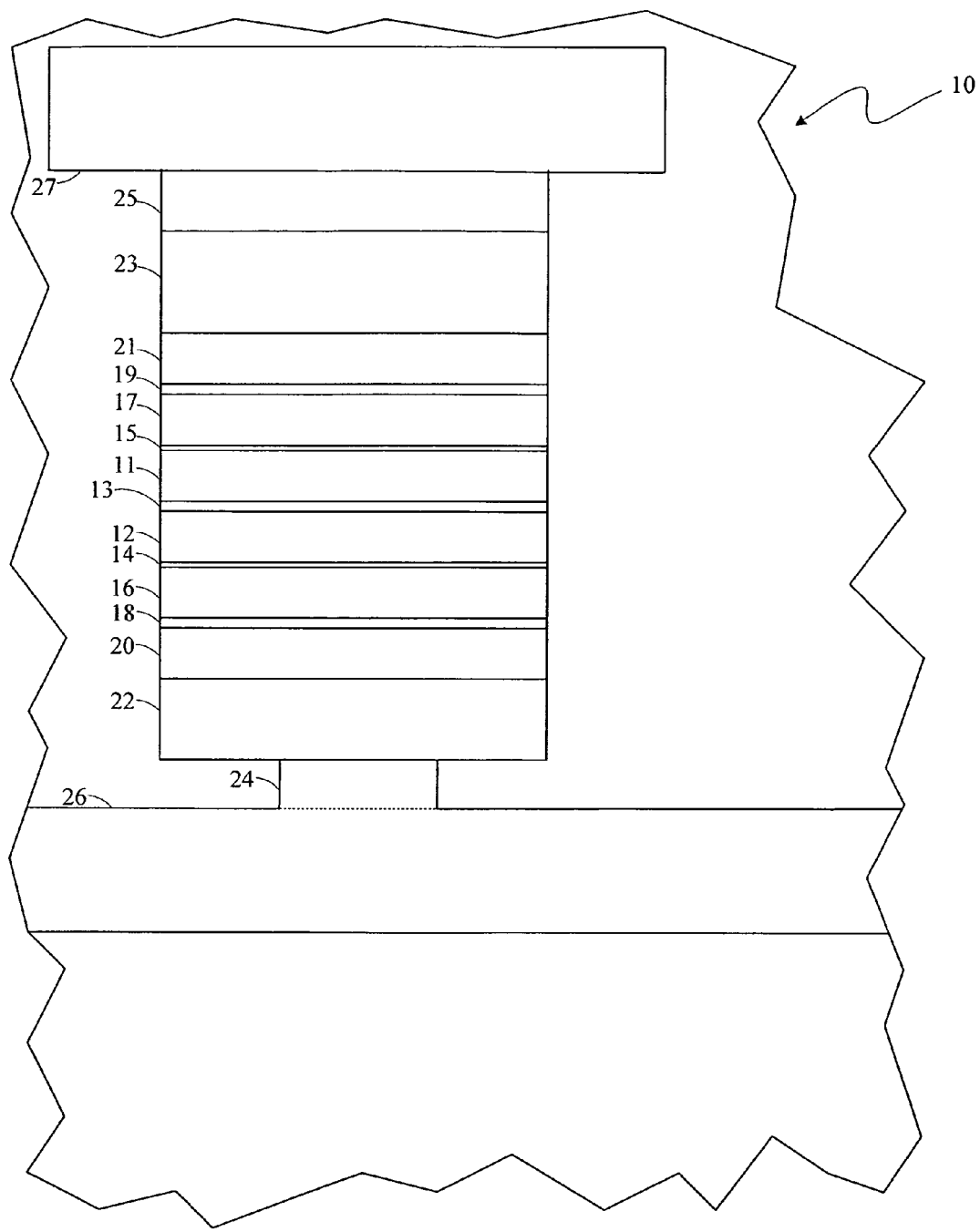
FIG. 1 shows a layer diagram of portions of a monolithic integrated circuit structure involving a circuit device.

In addition to the memory cell array biasing technique described above that allows determining the magnetic state of a cell in an array of spin current switched magnetoresistive device memory cells through establishing a sensing electrical current through that cell, and doing so without needing also a switching transistor in the cell, there is also another and different operational biasing technique useable for causing the magnetic state of the device in a selected cell to enter into, or remain in, the next desired one of the possible cell device magnetic states. The selection of a cell, and the selection of a magnetic state to be maintained or set into this selected cell, too, can be accomplished without the need for a switching transistor in the cell.

In this selected cell magnetic state setting process, however, the cell magnetic state setting current established in the cell must have a magnitude sufficient to exceed the cell magnetoresistive device switching current threshold value to successfully achieve switchings in the cell from one magnetic state to another. Nevertheless, this state setting current established in the cell must also be accomplished without the magnetic states of the magnetoresistive devices in any of the other unselected cells also being changed by the accompanying currents that also occur therein during the setting of the next magnetic state of the magnetoresistive device in the selected memory cell. That is, those accompanying currents occurring in other unselected or half selected cells must not exceed the state switching threshold current values in those remaining cells.

The state setting process referred to above allows the providing of a cell magnetic state setting electrical current exceeding the cell switching current thresholds in either direction along the current path through the magnetoresistive device in the selected cell. Which of the two oppositely directed currents is chosen to be established along the current path through the magnetoresistive device of the cell determines which of the two possible magnetic states is set into that device in the cell. Either of the two oppositely directed state setting currents established goes to ground through that one of the column (or row) interconnection conductors of the array to which a terminal of the selected cell is connected (whether a column or a row depending on the current direction through the cell) as a result of a part of the switching process used in selecting that cell. This part of the cell selecting process is accomplished through selecting to switch that column (or row) interconnection conductor connected to the selected cell to the ground voltage potential by a switch external to the array. This state setting current is supplied through that one of the row (or column) interconnection conductors of the array to which the other terminal of the selected cell is connected as the other part of the switching process used for selecting a cell to have its magnetic state set. This part of the process is accomplished through selecting to switch that row (or column) to a row (or column) selection voltage potential of a magnitude V (chosen as a representative value for example purposes) that is generally equal to the desired state setting current multiplied by the average resistance value of the array cell magnetoresistive devices R (i.e. the state setting current generally equals approximately V/R).

The remaining row interconnection conductors of the array, other than the one switched to the selection voltage potential as described above, are switched to row biasing voltage potentials with magnitudes equal to one-third that of the row selection voltage potential (V/3). The remaining column interconnection conductors, other than the one switched to ground as described above, are switched to column biasing voltage potentials with magnitudes equal to two-thirds that of the row selection voltage potential (⅔V). Thus, the row (or column) selection voltage potential can be chosen for the row interconnection conductor for the selected cell to have a magnitude sufficient to establish magnetic state setting spin currents through the magnetoresistive device in the selected cell to its grounded column interconnection conductor of magnitudes sufficiently exceeding the cell switching thresholds to thereby cause the device to change magnetic states if its current magnetization direction opposes the magnetization direction of the state setting spin current so established. All of the other row interconnection conductors, and all of the column interconnection conductors, have biasing voltages thereon with potential values that are smaller in magnitude than the selection voltage potential magnitude.

The resulting, though unwanted, alternative path currents that are also established through the remaining cells in the array other than the selected cell, in unavoidably having such currents accompany the provision of such a state setting current, have magnitudes each equaling one-third the magnitude of the state setting current. That is, the current in the magnetoresistive device of each cell that is connected between a) a row interconnection conductor (column interconnection conductor) [that is also connected to a biasing voltage of value V/3 rather than to the row (column) selection voltage of value V], and b) a column interconnection conductor (row interconnection conductor) [that is also connected to a biasing voltage of value 2V/3 rather than ground], (an unselected cell) is directed to the row interconnection conductor (column interconnection conductor) and is equal to $(2V/3-V/3)/R=V/3R$. The current in the magnetoresistive device of each cell that is connected between c) a row interconnection conductor (column interconnection conductor) [that is also connected to a biasing voltage of value V/3 rather than to the row (column) selection voltage of value V], and d) a column interconnection conductor (row interconnection conductor) that is connected to ground, (a half selected column cell) is directed to ground and is equal to $(V/3-0)/R=V/3R$. Finally, the current in the magnetoresistive device of each cell that is connected between e) a row interconnection conductor (column interconnection conductor) that is connected to the row (column) selection voltage of value V, and f) a column interconnection conductor (row interconnection conductor) [that is connected to a biasing voltage of value 2V/3 rather than ground], (a half selected row cell) is directed to the column interconnection conductor and is equal to $(V-2V/3)/R=V/3R$.

The determination of the values for the row and column (column and row) biasing voltages of V/3 and 2V/3, respectively, follows from the electrical conditions occurring upon the selection of a cell by switching the row (or column) interconnection conductor of the array to which the terminal of the selected cell is connected as the selected row (column) interconnection conductor to the row (or column) selection voltage potential of value V, and by switching the column (or row) interconnection conductor connected to the selected cell as the selected column (row) interconnection conductor to the ground voltage potential. As a result of such switching, the selected cell is connected between the row (or column) selection voltage potential of value V and ground to result in a current established through it to ground shown, and shown in the circuit schematic diagram of FIG. 4 for an example having the selection voltage potential source of value V connected to a row by two successive solid line arrows. Each of the other cells connected to that selected row interconnection conductor is in one of a plurality of circuit paths each containing it and just two other cells in each path extending through it and a minimum number of cells to ground as indicated in FIG. 4.

Figures 3, 4:
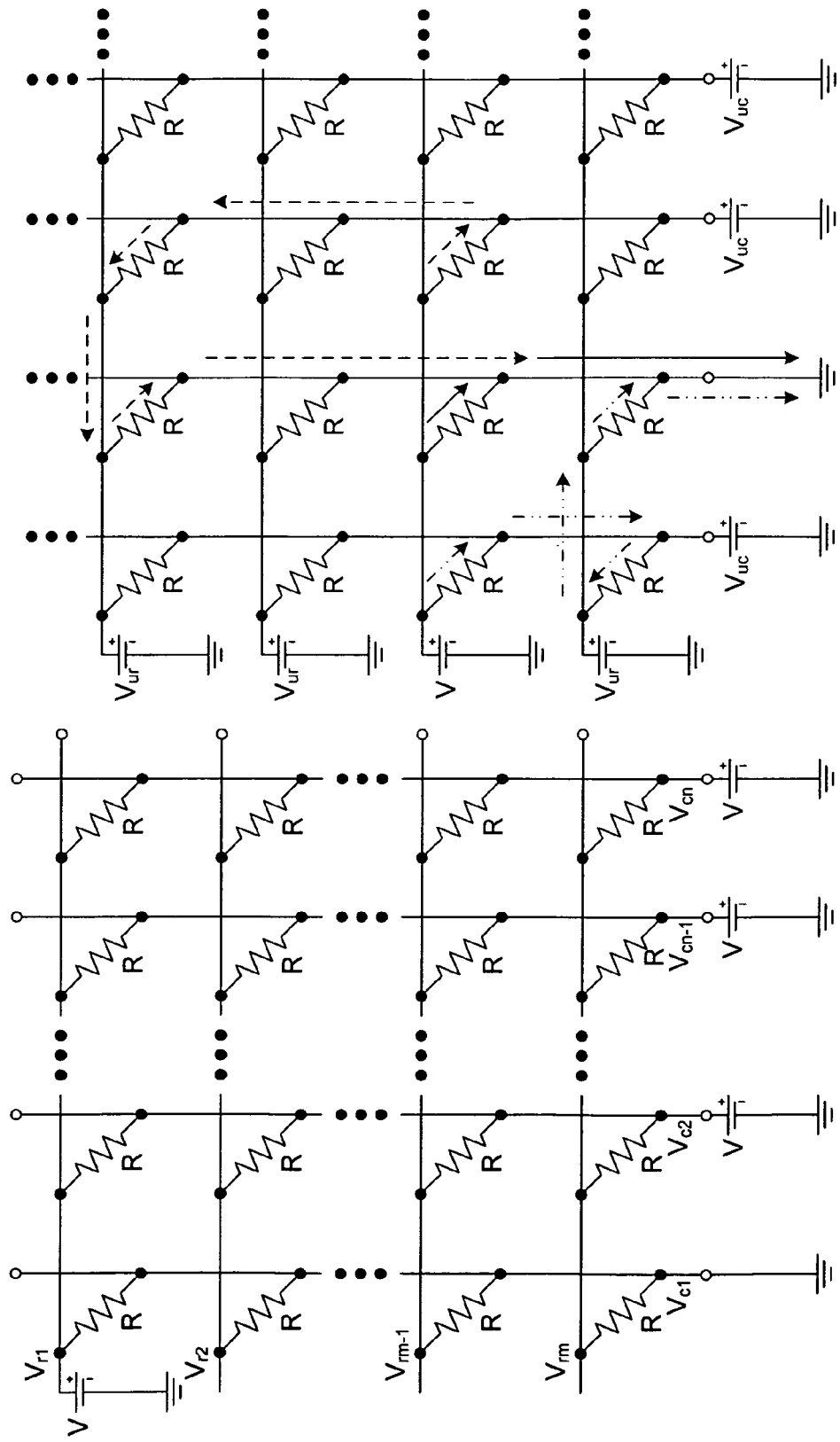
FIGS. 3 and 4 shows circuit schematic diagrams representing circuits providable in the structure of FIG. 2 using the devices of FIG. 1.

Any such circuit path through any one of the cells connected to this selected row interconnection conductor, other than the selected cell, begins in this example with a selected one of such cells, as the circuit path first cell, and next goes through that unselected column interconnection conductor to which this selected one of the other cells is connected, but which conductor is biased by a voltage source of a value not yet selected for this determination, and so is represented in FIG. 4 by $V_{uc}$. The starts of two alternative such circuit paths are shown as circuit path examples in the row connected selection voltage example of FIG. 4, one through the cell connected to the selected row interconnection conductor that is to the left of the selected cell, and with the current through it being indicated by a dots and dashes line arrow, and the other one through the cell that is to the right of the selected cell with the current through it being indicated by a dashed line arrow.

The corresponding circuit path continues from each of these circuit path first cells through any one of the other cells connected to this unselected column interconnection conductor to which the first cell is connected, as the circuit path second cell, which in turn is connected at its opposite end to a corresponding one of the other unselected row interconnection conductors not connected to the row selection voltage source. Again, this unselected row interconnection conductor is biased by a voltage source of a value not yet selected for this determination, and so is represented by $V_{ur}$. The example two alternative circuit paths started above are correspondingly continued by again using dots and dashes line arrows in the one path and dashed line arrows in the other path.

From the unselected row interconnection conductors to which the circuit path second cells are connected, the example two alternative circuit paths are completed through whichever of the cells, as circuit path third cells, is connected to such an unselected row interconnection conductor and that is also connected to the selected column interconnection conductor that is grounded. These completion potions of the example two alternative circuit paths are again marked by again using dots and dashes line arrows in the one path and dashed line arrows in the other path.

A selection made for the magnitude of the state setting current, sufficient to cause magnetic state changes in the magnetoresistive devices in the cells of the array, fixes the value of the row (or column) selection voltage potential V. The choice of values then for the row and column biasing voltages magnitudes $V_{ur}$ and $V_{uc}$ determines the voltages appearing across the circuit path first, second and third cells for each of such circuit path in the cell array. Those cell drop voltages then determine the currents in each cell in the circuit path.

The maximum difference between the cell switching current thresholds in each cell when not selected and the magnitude of the unwanted electric current established in that cell when some other cell has been selected to have the state setting current established therein, i.e. the maximum state setting current margin, occurs if the unwanted currents in each of the unselected cells are equal. Otherwise, selecting the row and column biasing voltages magnitudes $V_{ur}$ and $V_{uc}$ so that unequal currents are established the first, second and third cells in a circuit path will result in a current in at least one of them that is greater than the value resulting for equalized currents thereby leaving a smaller margin in that cell. Keeping the unwanted currents equal in each of the three unselected cells in a circuit path requires the same magnitude voltage drop across each such cell and so, with three cells in each circuit path, voltage drops of one-third of the row (or column) selection voltage potential V must be provided across each. This requires in turn that $V_{ur}=V/3$ and $V_{uc}=2V/3$ in the example of FIG. 4 thereby resulting in the unwanted current magnitude in each cell being equal to V/3R, while, as indicated above, the state setting current in a selected cell equals V/R.

Thus, here too, these magnitude differences between the state setting current and the accompanying unwanted cell currents can assure that the magnetic states of the magnetoresistive devices in the cells other than the selected cell remain unchanged during either the setting of, or the maintaining of the current magnetic state as, the next magnetic state of the magnetoresistive device in that selected memory cell. This result follows if the selected value of the state setting current is chosen small enough to avoid having the smaller accompanying currents in the remaining cells in the array, other than the selected cell, change the magnetic states of the magnetoresistive devices therein through the magnitudes of those accompanying currents being kept sufficiently smaller than the switching threshold current values of those other cells.

Figure 5:
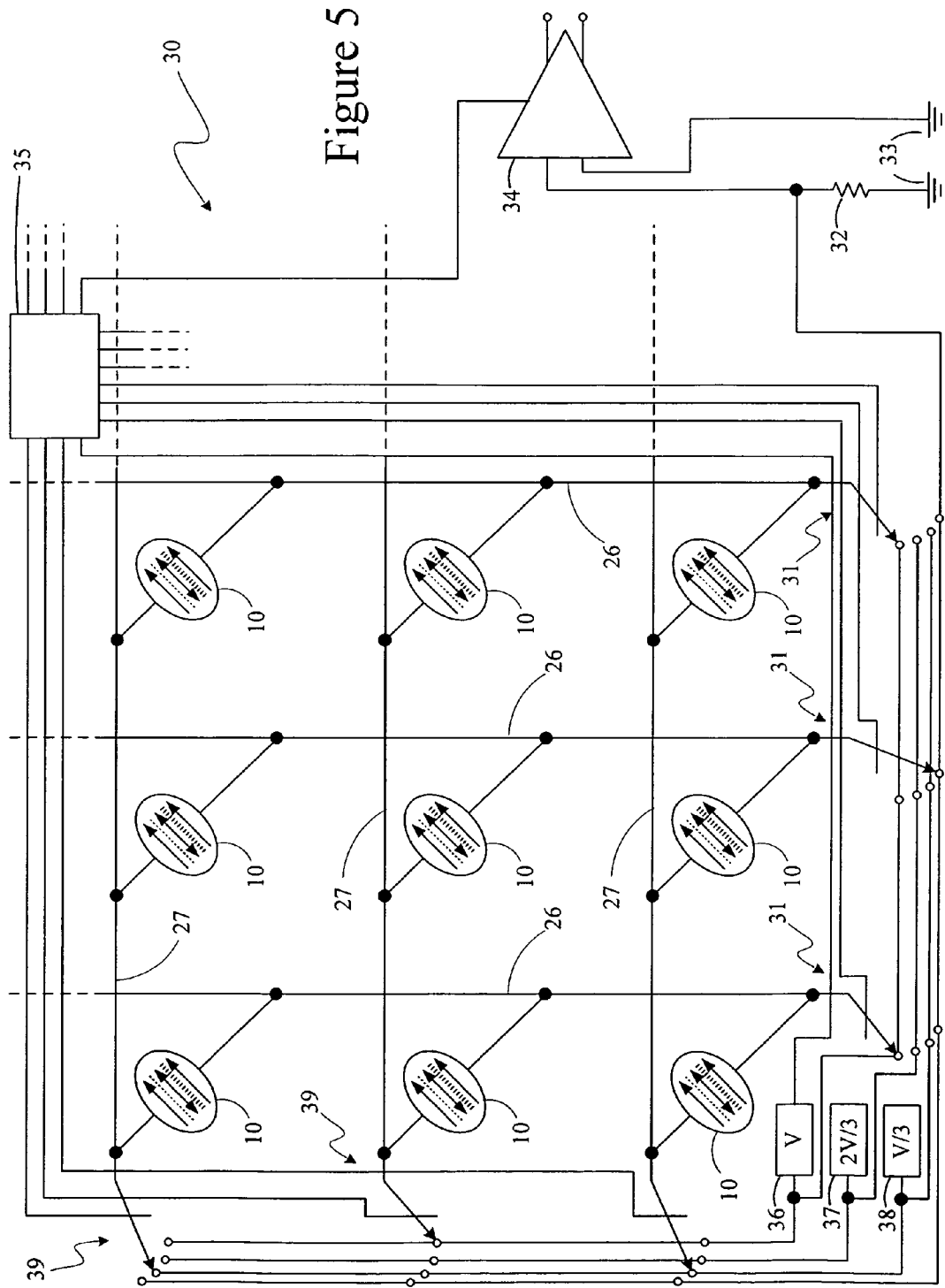
FIG. 5 shows circuit schematic diagram representing a circuit arrangement provided in the structure of FIG. 2 using the devices of FIG. 1.

Such a selectively controlled operationally biased technique memory cell array, 30, is shown in part in the representational circuit schematic diagram shown in FIG. 5 that also represents the example shown in FIG. 4. Spin current switched magnetoresistive devices 10 forming memory cells in an array thereof are shown in corresponding circuit symbol forms each connected between a corresponding row interconnection conductor 27 and a corresponding column interconnection conductor 26. Each such column interconnection conductor 26 is shown connected to the blade of a corresponding single blade, multiple pole switch, 31, presented here for representational purposes only in indicating the connections between various voltage sources and column interconnection conductors 26 in this example.

There are four poles shown for each of switches 31, one of which is connected through a near ground potential interconnection that is connected in turn to both a small value resistor, 32, (used to convert current values to scaled voltage values) having it opposite end connected to ground, 33, and to a measured signal input of a comparator, 34. Comparator 34 has internally selectable reference voltages with respect to ground to which the other input of comparator 34 is connected as the reference input, and the one of those reference voltages currently selected is set at a control terminal thereof by a controller, 35. Controller 35 also controls the positions of the blades in switches 31. Another pole of switches 31 is connected to a voltage source, 36, providing a potential value of V/3, and a further one of the poles is connected to a voltage source, 37, providing a potential value of 2V/3. The final pole in switches 31 is connected to a voltage source, 38, providing a potential value of V the magnitude of which is also controlled by controller 35.

Similarly, each row interconnection conductor 27 is shown connected to the blade of a corresponding single blade, multiple pole switch, 39, again presented here for representational purposes only in indicating the connections between various voltage sources and row interconnection conductors 27 in this example. Here, too, there are four poles shown for each of switches 39 connected as are the poles of switches 31 with one being connected through the near ground potential interconnection that is connected to both resistor 32 and to the measured signal input of comparator 34. The remaining poles of each of switches 39 are each correspondingly connected to one of voltage sources 36, 37 and 38.

Controller 35 also controls the positions of the blades in switches 39 and so, through controlling the blade positions of the various ones of switches 31 and 39, determines whether the magnetic state of the magnetoresistive device in a cell selected thereby is to enter into a different magnetic state, or remain in the current magnetic state, in directing that cell to its next desired magnetic state out of the possible cell device magnetic states. That is, controller 35 can direct that a selected row interconnection conductor have row selection voltage source 36 connected to it through its corresponding switch 39 to force it to a voltage value V, and further direct that a selected column interconnection conductor be grounded (near grounded) through its corresponding switch 31. Controller 35 thereby selects the corresponding cell connected between those two conductors and, concurrently, provides a voltage value of V across that cell to place the magnetoresistive device therein in the one of its two magnetic states corresponding to current passing from that row conductor to that column conductor. Controller 35 can also then direct the remaining row interconnection conductors be connected to voltage source 38 to force them each to a voltage value of V/3, and also direct the remaining column interconnection conductors be connected to voltage source 37 to force them each to a voltage value of 2V/3.

Controller 35 places the device in that selected cell into its other magnetic state by directing that same column interconnection conductor have now column selection voltage source 36 connected to it through its corresponding switch 31 to force it to a voltage value V, and further directing that same row interconnection conductor to be grounded (near grounded) through its corresponding switch 39. Controller 35 thereby selects the corresponding cell connected between those two conductors and, concurrently, provides a voltage value of V across that cell to place the magnetoresistive device therein in the one of its two magnetic states corresponding to current passing from that column conductor to that row conductor. Controller 35 can also then direct the remaining column interconnection conductors be connected to voltage source 38 to force them each to a voltage value of V/3, and also direct the remaining row interconnection conductors be connected to voltage source 37 to force them each to a voltage value of 2V/3.

Alternative to setting magnetic states in the magnetoresistive devices of the cells in the array, controller 35 can apply a much smaller voltage across a selected cell from row selection voltage source 36 through its corresponding switch 39 by setting source 36 to a much smaller voltage value V to establish just a sensing current through that cell. That sensing current will also pass through resistor 32 to provide a corresponding sensing voltage on the measured signal input of comparator 34 of a value depending on the cell device resistance as set by its current magnetic state. Controller 35 can also then direct the remaining column interconnection conductors be connected to voltage source 36 to force them each to a voltage value of V to thereby provide the cell device magnetic state sensing system described above that operates without having a transistor provided for each cell.

Figure 2:
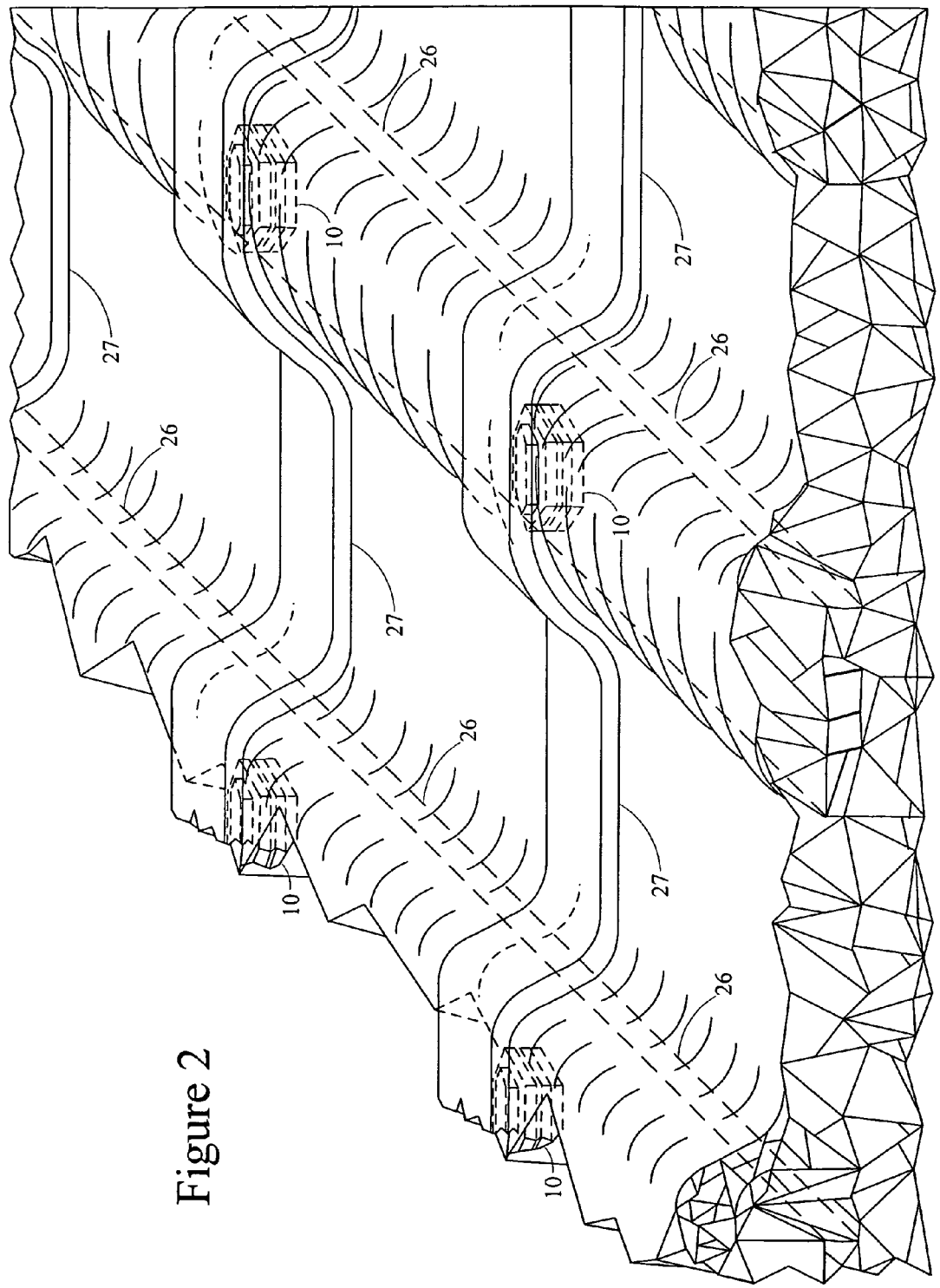
FIG. 2 shows a perspective view of portions of a monolithic integrated circuit structure with the circuit devices of FIG. 1.
Figure 6:
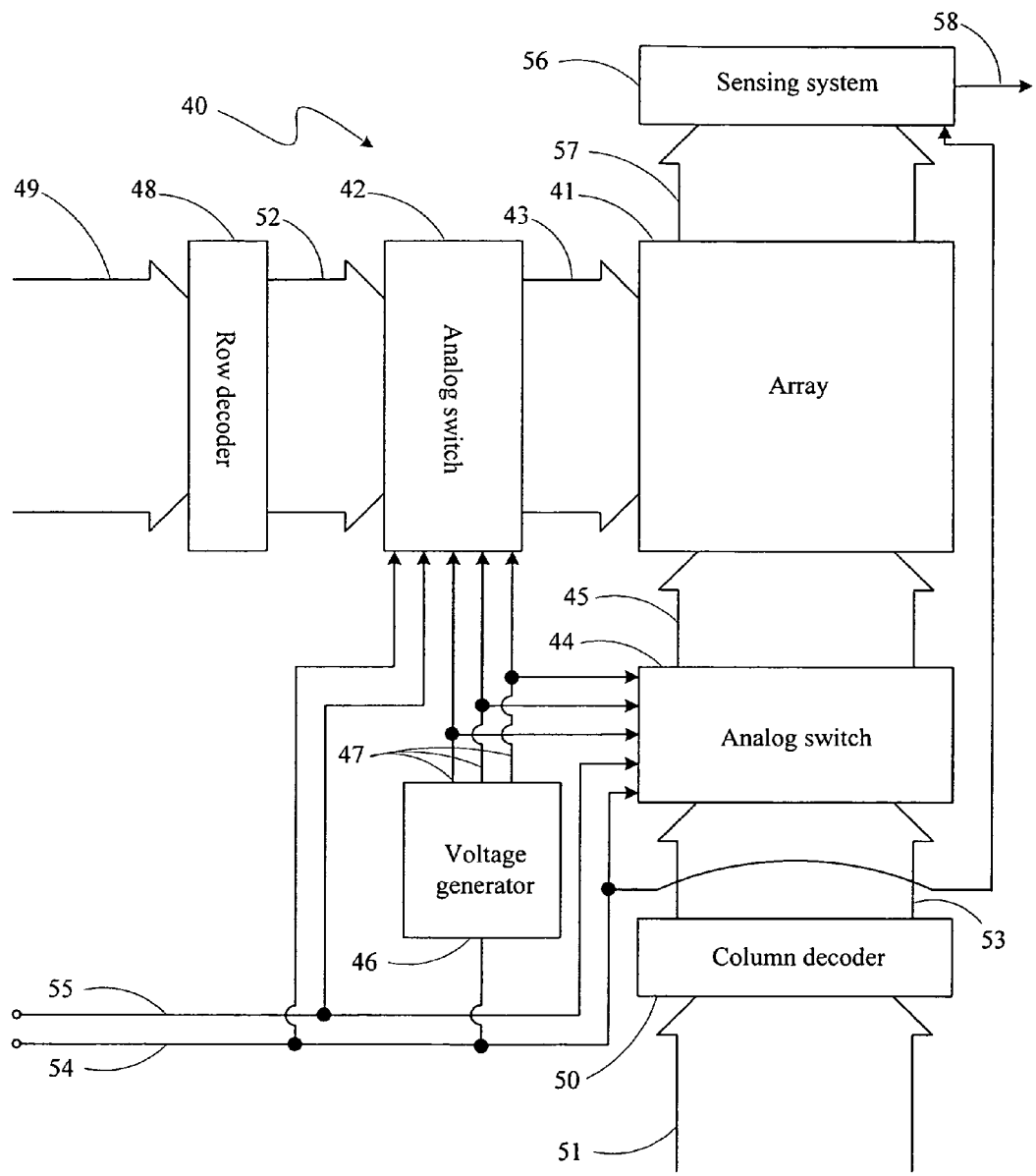
FIG. 6 shows system diagram representing a digital logic device system representing a circuit arrangement provided in the structure of FIG. 2 using the devices of FIG. 1, and FIGS. 7A and 7B show graphs with plots representing results that may be obtainable for the circuit arrangements of FIGS. 5 and 6.

A digital logic device system implementation suitable to be provided in a monolithic integrated circuit chip to implement a system providing information storage in the alternative magnetic states of cell magnetoresistive devices in a cell array of such devices such as shown in FIGS. 1 and 2, and the corresponding switching operations for storing and retrieving such information, that is generally and effectively similar to what is indicated in the system shown in representational form in FIG. 5, is shown as a digital memory system, 40, in block diagram form in FIG. 6. Typically, an array, 41, of spin current switched magnetoresistive device cells interconnected with row and column interconnection conductors is provided in and on the chip with there being a large number of cells to thereby provide the capability to store relatively large amounts of information.

A digitally controlled analog voltage switch, 42, is interconnected with the row interconnection conductors in array 41 through an interconnection bus 43, and a further digitally controlled analog voltage switch, 44, is interconnected with the column interconnection conductors in that array through another interconnection bus 45. Analog voltage switches 42 and 44, in response to selected input command signals from a controller (not shown), switch appropriate ones of voltage values V, 2V/3 and V/3 (or approximately those values as further indicated below), supplied thereto from a voltage values generator, 46, over voltage supply interconnections, 47, to the row and column interconnections in array 41 through buses 43 and 45. These command signals comprise a row address signal supplied to a row decoder, 48, on a row address bus, 49, and a column address signal supplied to a column decoder, 50, on a column address bus, 51. The row address signal selects a word line in an output word line bus, 52, connected to analog voltage switch 42, that in turn selects the row interconnection conductor connected to the array cell selected to undergo the next memory data storage or retrieval operation, and the column address signal selects a bit line in an output bit line bus, 53, connected to analog voltage switch 44, that in turn selects the column interconnection conductor connected to that selected array cell.

In addition, a data storage or retrieval signal is provided over a data storage or retrieval signal interconnection, 54, that is connected to both analog switches 42 and 44 with that signal selecting which of the voltage values supplied by generator 46, if any, are to be applied to the selected and unselected row and column interconnection conductors of array 41 both for data storage and data retrieval. The data storage or retrieval signal is also supplied to generator 46 to set the magnitude for voltage value V supplied thereby to either a) result in the desired magnetic state setting current for data storage, or to b) result in the desired magnetic state sensing current for data retrieval.

Further, a data value signal is provided over a data value interconnection, 55, that is connected to both analog switches 42 and 44 with that signal selecting which of the selected row and column interconnection conductors is to have voltage value V supplied thereto in data storage operations. This selection determines the direction in which electrical current is established in the selected cell to thereby select which of the two possible magnetic states the cell is to be in at the end of a data storage operation and so whether the cell is storing, in its next magnetic state, a "1" or a "0" logic value. Thus, to store a "1" logic value in a selected cell in array 41, the selected row interconnection conductor connected thereto is also connected by switch 42 to the generator 46 source of voltage value V of a magnitude to provide the desired magnetic state setting current with the unselected row interconnection conductors being connected by switch 42 to the generator 46 source of voltage value V/3, and the selected column interconnection conductor connected to the selected cell is connected by switch 44 to essentially zero volts with the unselected column interconnection conductors being connected by switch 44 to the generator 46 source of voltage value 2V/3. To instead store a "0" logic value in that selected cell, the selected column interconnection conductor connected thereto is also connected by switch 44 to the generator 46 source of voltage value V of a magnitude to provide the desired magnetic state setting current with the unselected column interconnection conductors being connected by switch 44 to the generator 46 source of voltage value V/3, and the selected row interconnection conductor connected to the selected cell is connected by switch 42 to essentially zero volts with the unselected row interconnection conductors being connected by switch 42 to the generator 46 source of voltage value 2V/3.

Finally, the data storage or retrieval signal is also provided to a cell voltage sensing system, 56, which receives the sensing currents through a sense currents bus, 57, that are established through decoder selected cells in array 41 by analog switches 42 and 44 and voltage supply generator 46 to allow determination of the magnetic states of those cells and, so, retrieve the information as to whether they have "1" or "0" logic state values stored therein. Thus, to determine the current magnetic state of a selected cell, the row interconnection conductor connected thereto is also connected by switch 42 to the generator 46 source of voltage value V of a magnitude to provide the desired magnetic state sensing currents with the unselected row interconnection conductors being connected by switch 42 to nothing, i.e. left as open circuits, and the selected column interconnection conductor connected to the selected cell is connected by switch 44 to essentially zero volts with the unselected column interconnection conductors being connected by switch 44 to the generator 46 source of voltage value V. The magnetic state sensing currents established through the selected cells in array 41 also extend through sense currents bus 57 to cell voltage sensing system 56 that is activated by the data storage or retrieval signal to measure these currents through their setting corresponding logic states in autozeroing latch cells to provide the logic state voltage values at a sensing system output, 58.

In fabricating integrated circuit chips like that shown in FIG. 6, there will be a range of resistance values in the resulting cell magnetoresistive devices because of fabrication process variations of many kinds. Too large a range can render the chip system inoperable or partially inoperable. Even smaller distributions of resistance values among the cell devices over the array provided by the chip can affect the above described biasing arrangements in sometimes unpredictable manners. In these latter circumstances, the row and column interconnection conductors bias voltages may need to be changed from the nominal (⅓) and (⅔) fractional values of the row (column) selection voltage value as was described above. In practice, these biasing voltages can be altered from these nominal values to thereby counter the resistance variation in and among the cell magnetoresistive devices to thereby maximize both magnetic state setting and magnetic state determination margins by proceeding as follows:

1. Set the nominal values for $V_{ur}$ and $V_{uc}$ (See FIG. 4),
2. Test a fabricated memory chip device with these nominal biasing values for yield of device data storage process acceptable performances,
3. Analyze yield data,
4. If yield is sufficient, go to step 8,
5. If not, set new values for $V_{ur}$ and $V_{uc}$ in a steepest descent search algorithm searching for the minimum error in the device data storage process acceptable performances in the final choice for $V_r$ and $V_{uc}$, insofar as having the fewest number of half selected or unselected cell devices having their switching thresholds exceeded by the corresponding unwanted current established therein for the current resulting from the row (column) select voltage exceeding the switching threshold of the selected cell device, and test the fabricated device with these nominal biasing values for data storage process acceptable performances
6. Analyze yield data,
7. If write yield is not sufficient, repeat from step 5 for $V_{ur}$ and $V_{uc}$ based on using new values with the search algorithm, and
8. Choose for operating the fabricated devices the row and column biasing voltage values found using the search algorithm for $V_{ur}$ and $V_{uc}$ that provide acceptable data storage process performances yield.

Even with having found optimal values for $V_{uc}$ and $V_{ur}$, there will be a distribution of magnitudes of selected electrical currents established in the selected cell devices, and a distribution of magnitudes of unwanted currents in the unselected cell devices, i.e. unselected ($I_{unsel}$) currents, occurring in the memory cells of array 41 during data storage operations therein. Such current magnitudes distributions are due in part to the changes in resistance values between the larger and smaller resistance values corresponding to the alternative magnetic states of the spin current switched magnetoresistive devices forming those cells. These device alternative magnetic states in each cell represent the data bit stored therein in together providing the assemblage of data stored in that array. In addition, as indicated above, there is also an inevitable distribution in those resistance values of these cell devices resulting from the unavoidable process variations that occur during the device manufacturing process.

The resistance values of the cell devices in array 41 due to manufacturing process variations are found to follow approximately a Gaussian probability density function with a mean value for the resistances of the smaller, or lower, resistance value magnetic states represented as $R_L$. The switchings between the alternative magnetic states of the cell devices represents, electrically, a sequence of discrete time changes between the larger and smaller resistance values of such alternative states. The smaller resistance values have, as indicated above, a mean represented as RL and also have a variance represented as $\sigma^2 L$. The greater resistance values have a mean of $(1+MR)\,R_L$, where MR the magnetoresistance ratio of a cell device between its smaller and larger resistance values.

This resistance shift sequence based resistance values distribution has a standard deviation that can be approximately represented as $$\sigma_{MR} \approx \frac{MR*\langle R_L \rangle}{2},$$

where $\sigma_{MR}$ is the standard deviation resulting from the change in resistance related to data stored in the array and, in its depending on other factors than the manufacturing process variations, is substantially uncorrelated with the distribution of resistance values of the cell devices in array 41 due to manufacturing process variations. Thus, the sum of the resistance of the smaller resistance value magnetic state of a device and the and the resistance increment, if any, of the device state change resistance to give the total device resistance has a variance, $\sigma^2_R$, given as $$\sigma_R^2 = \sigma_{MR}^2 + \sigma_L^2.$$

Figure 7A:
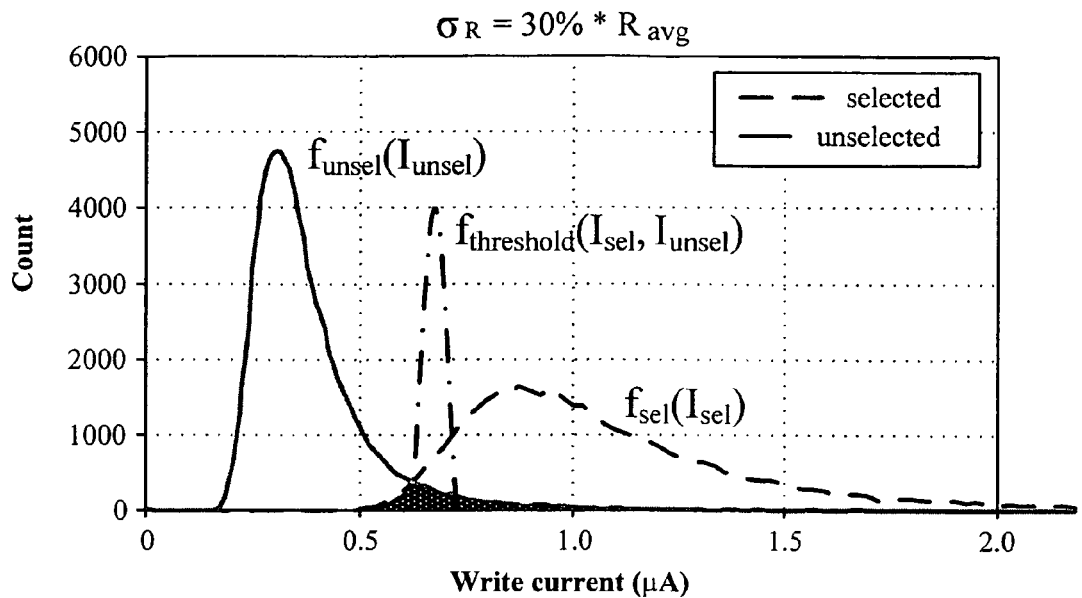
Figure 7B:
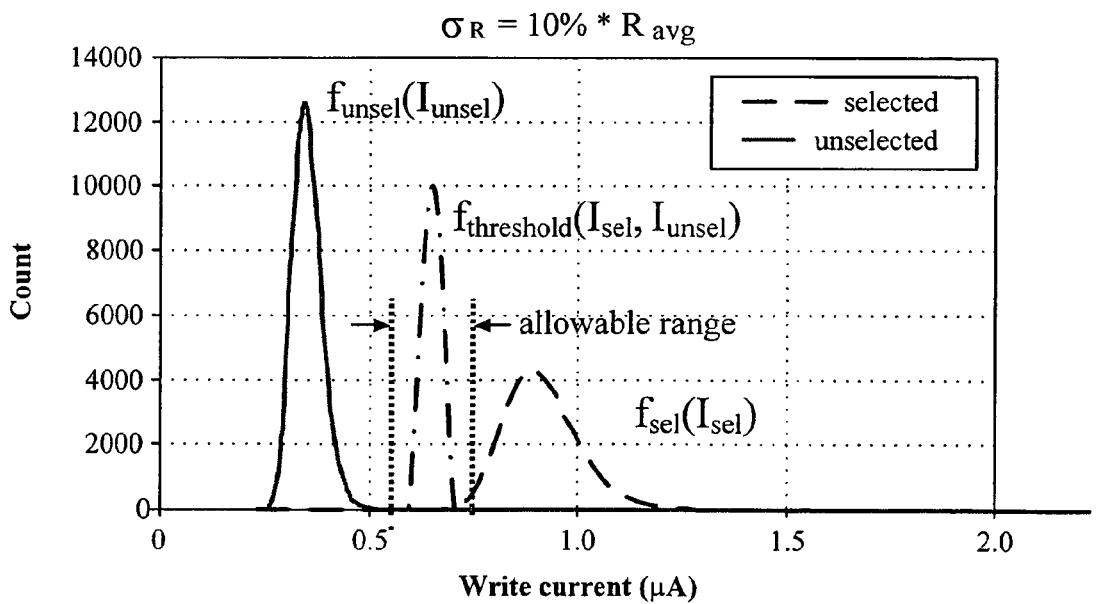

The probability density or frequency functions of cell currents resulting from the approximately Gaussian probability density function of device total resistances are represented in the graphs of FIGS. 7A and 7B. Both figures have plots representing the probability density functions of currents in array 41 during data storage operations with $f_{sel}(I_{sel})$ representing the density or frequency function of magnetic state setting currents, $I_{sel}$, for all selected cell devices shown in dashed line form, and $f_{unsel}(I_{unsel})$ representing the probability density or frequency function of accompanying unwanted currents, $I_{unsel}$, in all unselected cell devices (with $I_{unsel}$ equaling any of $I_u$, $I_{1/2r}$ or $I_{1/2c}$) and shown in solid line form. The values for the various currents are computed in a simulation for these graphs based on using a Gaussian probability density function for the resistance values of the cell devices in the array 41 and calculating the currents that flow through each of those devices (omitting division by the total number of trials) for the devices being (a) a selected device with the row (column) selection voltage having been applied to the row (column) interconnection conductor in array 41 to which this device is connected with its connected column (row) interconnection conductor switched to, or near to, ground), and for the devices being (b) an unselected device (at least one side of the device connected to a different row or column interconnection conductor and often with both sides so connected). In addition, example current switching threshold density functions are shown superimposed in dot and dashed line form in these figures for the magnetoresistive cell devices represented by $f_{threshold}(I_{sel}, I_{unsel})$, and these switching thresholds have also been found to have magnitude values distributed with approximately Gaussian probability densities.

Thus, these resulting current probability density or frequency functions are both reciprocal Gaussian probability density functions, as reciprocal functions of the resistance values density ($I=V_{sel}/R$), and such that the range of the unselected currents density $f_{unsel}(I_{unsel})$ is shown as ⅓ the range of the selected currents density $f_{sel}(I_{sel})$, and the maximum magnitude of the unselected device current density is shown as 3 times the magnitude of the selected currents density. This scaling relationship between $f_{unsel}(I_{unsel})$ and $f_{sel}(I_{sel})$ is determined by the relative values of $I_{sel}$ and $I_{unsel}$ as described above for the selected and unwanted (unselected) cell currents based on assuming the nominal values are used for $V_{ur}$ and $V_{uc}$, and this is reflected in the simulation results shown in FIGS. 7A and 7B.

The current density functions for the selected and unselected currents represented in FIG. 7A result from the standard deviation $\sigma_L$ for the resistances of the smaller, or lower, resistance value magnetic states having a value equal to 30% of the mean value of those resistances, $R_L$. The overlap between the resulting selected current and unselected current density functions represented results in the occurrences of errors during data storage operations since the selection of the magnitude of the row (column) selection voltage to provide the current densities shown leads to some of the selected currents provided in the density $f_{sel}(I_{sel})$ being insufficient to switch the magnetic states of some of the selected cell devices, and to some of the unselected currents provided in the density $f_{unsel}(I_{unsel})$ being sufficient to switch the magnetic states of some of the unselected cell devices.

If the selection of the magnitude of the row (column) selection voltage to provide the current densities is increased such that the resulting magnetic state setting currents in any selected devices will always exceed the switching thresholds in those selected devices (i.e. move the density $f_{sel}(I_{sel})$ to the right in FIG. 7A), the fixed relationship between that density and the density $f_{unsel}(I_{unsel})$ will also lead to the density $f_{unsel}(I_{unsel})$ moving to the right in FIG. 7A so that even more of the accompanying unwanted currents in the unselected cell devices will be of magnitudes that exceed the switching thresholds of some of those unselected cell devices. If that is avoided at least in part by choosing a smaller value for the magnitude of the row (column) selection voltage (thus moving the densities in FIG. 7A to the left), then more of the resulting magnetic state setting currents in some of the selected devices will be less than the switching thresholds in those selected devices.

The current density functions for the selected and unselected currents in FIG. 7B, alternatively, result from the standard deviation $\sigma_L$ for the resistances of the smaller, or lower, resistance value magnetic states having a value equal to 10% of the mean value of those resistances, $R_L$. A sufficient gap between the resulting selected current and unselected current density functions, including the gap shown, allows for avoiding the occurrences of errors during data storage operations. A selection of the magnitude of the row (column) selection voltage can be made such that the resulting magnetic state setting currents in any selected devices will always exceed the switching thresholds in those selected devices, and the accompanying unwanted currents in the unselected cell devices will be of magnitudes that are less than the switching thresholds of those unselected cell devices, again, at least in those instances of sufficiently large gaps.

Thus, when $\sigma_R$ is relatively large, as shown in FIG. 7A, there is an overlap in the $f_{unsel}(I)$ and $f_{sel}(I)$ density functions that will typically cause some unselected cell devices to have the magnetic state therein changed in error, and will result in some selected cell devices not having the magnetic state therein be changed also in error. The greater the overlap between the density functions the greater the risk of data storage errors. When $\sigma_R$ is relatively small, in contrast as shown in FIG. 7B, there is sufficient separation between the $f_{unsel}(I_{unsel})$ and $f_{sel}(I_{sel})$ density functions that array 41 can undergo data storage operations with negligible error rates. To be assured of error free data storage operations, there is an allowable range for the current switching threshold density functions $f_{threshold}(I_{sel}, I_{unsel})$ shown superimposed in these figures for the magnetoresistive cell devices resulting from the fabrication of array 41. That is, a device switching control current threshold range, $I_c$, as a suitable measure of the width of the current switching threshold density function $f_{threshold}(I_{sel}, I_{unsel})$ (a sum of a selected number of standard deviations of that density function), characterizing those fabricated cell devices, must have a value that falls within the range between the greatest value side of $f_{unsel}(I_{unsel})$ and the smallest value side of $f_{sel}(I_{sel})$. This range may be defined as $$I_c \text{ Range}: \langle I_{unsel}\rangle + \frac{N}{2}\sigma_{unsel} < I_c < \langle I_{sel}\rangle - \frac{N}{2}\sigma_{sel}$$

where "N" denotes the number of standard deviations separation required to achieve some specified error rate, $\langle I_{sel}\rangle$ denotes the average magnetic state setting current establishable in a selected array cell device, and $\langle I_{unsel}\rangle$ ... denotes the average accompanying unwanted current resulting in a half selected or unselected cell device, $\sigma_{sel}$ denotes the standard deviation of the $f_{sel}(I_{sel})$ density function, and $\sigma_{unsel}$ denotes the standard deviation of the $f_{unsel}(I_{unsel})$ density function.

The foregoing pair of inequalities shows that the separation occurring between $\langle I_{unsel}\rangle$ and $\langle I_{sel}\rangle$ can be expressed as $$\frac{N}{2}\sigma_{unsel} + \frac{N}{2}\sigma_{sel} + I_c,$$

where again N is the desired number of standard deviations separation between the $f_{unsel}(I_{unsel})$ and $f_{sel}(I_{sel})$ density functions. These functions may be approximately specified in terms of $\sigma_R$, and thus the MR and $R_L$ density function characterizing values, as $$\sigma_{unsel} \approx \frac{1}{3}\frac{V}{\langle R\rangle} - \frac{1}{3}\frac{V}{\langle R\rangle + \sigma_R} \approx \frac{1}{3}\frac{V}{\langle R\rangle}\frac{\sigma_R}{\langle R\rangle}$$

and $$\sigma_{sel} \approx \frac{V}{\langle R\rangle} - \frac{V}{\langle R\rangle + \sigma_R} \approx \frac{V}{\langle R\rangle}\frac{\sigma_R}{\langle R\rangle}$$

where R is the average resistance of the cell devices in array 41 over their various magnetic states. The last three equations and the previous equations for $\sigma_{MR}$ and $\sigma_R^2$ can be used to provide an operating criterion relating allowable range for the device switching control current threshold range $I_c$ to $\sigma_L$ and MR. This relationship is accurate to within a factor of 2 in view of the unknowns involved with the various probability density functions involved and is given by $$I_c < \frac{1}{3}\frac{V}{\langle R \rangle}\left\{2 - N\frac{\sqrt{(MR/2)^2 + \sigma_L^2}}{\langle R \rangle}\right\}.$$

Thus, an approximate range of cell resistance distribution parameters yielding $I_c \sim 0.5 \cdot \langle I_{sel} \rangle$ can be obtained from fabricated cell devices yielding $\sigma_R/R=0.1$ and $N=6$ which are reasonably obtainable in fabricating cell magnetoresistive devices 10. Here, those cell devices also yield $\sigma_L \sim 10\%$ R and the magnetoresistance ratio MR~0.1 or 10%. Although cell devices with greater magnetoresistance ratios are commonly fabricated, devices with maximized magnetoresistance ratios can be seen from the last equation to not be desirable for array 41 using this selected cell magnetic state setting process as they would serve to reduce the switching control current threshold range $I_c$.

Although the present invention has been described with reference to preferred embodiments, workers skilled in the art will recognize that changes may be made in form and detail without departing from the spirit and scope of the invention.

The invention claimed is:

1. A ferromagnetic thin-film based digital memory system having memory cells selected through voltage values supplied coincidentally on interconnections made thereto, said memory comprising:

a plurality of ferromagnetic thin-film based bit structures, each supported on a substrate and separated from one another by spacer material therebetween, each said bit structure being capable of being switched successively between alternative electrical resistance states by switching voltages having magnitudes exceeding switching voltage thresholds thereof and that are selectively applied between first and second ends of said bit structures so as to provide suitable polarity thereacross, and each said bit structure being capable of having a current electrical resistance state thereof determined by measurement voltages of magnitudes less than said switching voltage thresholds and that are selectively applied between said first and second ends thereof;

a plurality of word line structures each having a pair of word line end terminal regions adapted to conduct electrical current therethrough with each of said pairs of word line end terminal regions having an electrical conductor connected therebetween which is electrically connected to each said first end of those of said plurality of bit structures that are in a corresponding one of a plurality of word line fractions of said plurality of bit structures;

a plurality of bit line structures each having a pair of bit line end terminal regions adapted to conduct electrical current therethrough with each of said pairs of bit line end terminal regions having an electrical conductor connected therebetween which is electrically connected to each said second end of those of said plurality of bit structures that are in a corresponding one of a plurality of bit line fractions of said plurality of bit structures, and with there being a said bit structure from each of said plurality of word line fractions in each said bit line fraction and a switching system, suited for electrical connection to a source of voltage, and selectively electrically connected to each of said word line and bit line end terminal regions, said switching system being capable of selectively providing at selected state change ones of said word line and bit line end terminal regions said switching voltages of selected polarities, and further capable of providing reference voltages at selected said word line and bit line end terminal regions other than said selected state change ones thereof having magnitudes that are selected multiples or fractions, or both, of said magnitudes of said switching voltages.

2. The system of claim 1 wherein none of said reference voltages provided at said selected word line and bit line end terminal regions other than said selected state change ones have magnitudes that are greater than said switching voltage thresholds of said bit structures in said plurality thereof.

3. The system of claim 2 wherein said selected switching voltages magnitude fractions include fractions approximately equal to one-third and two-thirds.

4. The system of claim 2 wherein said selected switching voltages magnitude multiples include a multiple approximately equal to zero.

5. The system of claim 1 wherein said switching system is further capable of selectively providing at selected measurement ones of said word line and bit line end terminal regions said measurement voltages, and further capable of providing activation voltages at selected said word line and bit line end terminal regions other than said selected measurement ones thereof having magnitudes that are selected multiples or fractions, or both, of said magnitudes of said measurement voltages.

6. The system of claim 5 wherein said switching system is further capable of selectively electrically disconnecting from selected said word line and bit line end terminal regions other than said selected measurement ones thereof.

7. The system of claim 5 wherein none of said activation voltages provided at said selected word line and bit line end terminal regions other than said selected measurement ones have magnitudes that are greater than said switching voltage thresholds of said bit structures in said plurality thereof.

8. The system of claim 7 wherein none of said reference voltages provided at said selected word line and bit line end terminal regions other than said selected state change ones have magnitudes that are greater than said switching voltage thresholds of said bit structures in said plurality thereof.

9. The system of claim 7 wherein said selected activation voltages magnitude multiples include a multiple nearly equal to zero.

10. The system of claim 9 wherein those said selected activation voltages that are nearly zero, and that are provided to said selected word line and bit line end terminal regions other than said selected measurement ones, differ from being zero primarily due to voltage across a current sensing resistor electrically connected in series with each one of said selected word line and bit line end terminal regions other than said selected measurement ones to which such nearly zero activation voltages are provided.

11. The system of claim 1 wherein each of said plurality of ferromagnetic thin-film based bit structures is formed of a plurality of layers provided in a selected sequence between said first and second ends of said bit structures comprising a memory film of an anisotropic ferromagnetic material capable of conducting an electrical current therethrough, a source layer positioned on one side of said memory film capable of conducting an electrical current therethrough so that a majority of conduction electrons passing therefrom have a selected spin orientation, an electrically insulative intermediate layer positioned between said source layer and said memory film, and a disruption layer positioned on another side of said memory film capable of conducting an electrical current therethrough so that spins of conduction electrons passing therefrom are substantially random in orientation.

12. A method for determining present, and for changing between alternative, resistance states of a plurality of ferromagnetic thin-film based bit structures that are each supported on a substrate separated from one another by spacer material therebetween, and are a) capable of being switched successively between alternative electrical resistance states by switching voltages having magnitudes exceeding switching voltage thresholds thereof that are selectively applied between first and second ends of said bit structures so as to provide suitable polarity thereacross, and are b) further capable of having a current electrical resistance state thereof determined by measurement voltages of magnitudes less than said switching voltage thresholds that are selectively applied between said first and second ends thereof, and that are selectively interconnected with a plurality of word lines each of which is electrically connected to each said first end of those of said plurality of bit structures that are in a corresponding one of a plurality of word line fractions thereof, and with a plurality of bit lines each of which is electrically connected to each said second end of those of said plurality of bit structures that are in a corresponding one of a plurality of bit line fractions thereof such that there is a said bit structure from each of said plurality of word line fractions in each said bit line fraction, said method comprising:

providing a switching voltage to a selected state change one of said pluralities of word lines and bit lines and providing a selection reference voltage to an opposite end of a bit structure that is electrically connected to said selected state change one of said pluralities of word lines and bit lines as the bit structure selected to be subject to having said switching voltage applied thereacross at least in part; and providing reference values setting voltages, substantially coincidentally with said providing of said switching voltage, on selected ones of said pluralities of word lines and bit lines other than said state change one of said pluralities of word lines and bit lines that have magnitudes including values equaling a plurality of fractions of said switching voltage.

13. The method of claim 12 wherein said plurality of fractions include the fractional values of one-third and two-thirds.

14. The method of claim 12 further comprising terminating said providing of a switching voltage and said providing of reference values setting voltages, and thereafter providing a measurement voltage to a selected measurement one of said pluralities of word lines and bit lines and providing a selection activation voltage to an opposite end of a bit structure that is electrically connected to said selected measurement one of said pluralities of word lines and bit lines as the bit structure selected to be subject to having said measurement voltage applied thereacross at least in part, and providing activation values setting voltages, substantially coincidentally with said providing of said measurement voltage, on selected ones of said pluralities of word lines and bit lines other than said measurement one of said pluralities of word lines and bit lines that have magnitudes including values equaling said measurement voltage.

15. The method of claim 14 further comprising leaving selected ones of said pluralities of word lines and bit lines, other than said measurement one of said pluralities of word lines and bit lines and other than those thereof having activation values setting voltages provided thereat, without any provision thereat of voltages or electrical currents from sources external to said plurality of bit structures, said word lines and said bit lines.

16. A ferromagnetic thin-film based digital memory system having memory cells selected through voltage values supplied coincidentally on interconnections made thereto, said memory comprising:

a plurality of ferromagnetic thin-film based bit structures, each supported on a substrate and separated from one another by spacer material therebetween, each said bit structure being capable of being switched successively between alternative electrical resistance states by switching voltages having magnitudes exceeding switching voltage thresholds thereof and that are selectively applied between first and second ends of said bit structures so as to provide suitable polarity thereacross, and each said bit structure being capable of having a current electrical resistance state thereof determined by measurement voltages of magnitudes less than said switching voltage thresholds and that are selectively applied between said first and second ends thereof;

a plurality of word line structures each having a pair of word line end terminal regions adapted to conduct electrical current therethrough with each of said pairs of word line end terminal regions having an electrical conductor connected therebetween which is electrically connected to those of said plurality of bit structures that are in a corresponding one of a plurality of word line fractions of said plurality of bit structures;

a plurality of bit line structures each having a pair of bit line end terminal regions adapted to conduct electrical current therethrough with each of said pairs of bit line end terminal regions having an electrical conductor connected therebetween which is electrically connected to those of said plurality of bit structures that are in a corresponding one of a plurality of bit line fractions of said plurality of bit structures, and with there being a said bit structure from each of said plurality of word line fractions in each said bit line fraction interconnected solely between a corresponding word line and a corresponding bit line;

a switching system, suited for electrical connection to a source of voltage, and selectively electrically connected to each of said word line and bit line end terminal regions, said switching system being capable of selectively providing at selected state change ones of said word line and bit line end terminal regions said switching voltages of selected polarities, and further capable of providing reference voltages at selected said word line and bit line end terminal regions other than said selected state change ones thereof having magnitudes that are selected multiples or fractions, or both, of said magnitudes of said switching voltages.

17. The system of claim 16 wherein none of said reference voltages provided at said selected word line and bit line end terminal regions other than said selected state change ones have magnitudes that are greater than said switching voltage thresholds of said bit structures in said plurality thereof.

18. The system of claim 17 wherein said selected switching voltages magnitude fractions include fractions approximately equal to one-third and two-thirds.

19. The system of claim 17 wherein said selected switching voltages magnitude multiples include a multiple approximately equal to zero.

20. The system of claim 16 wherein said switching system is further capable of selectively providing at selected measurement ones of said word line and bit line end terminal regions said measurement voltages, and further capable of providing activation voltages at selected said word line and bit line end terminal regions other than said selected measurement ones thereof having magnitudes that are selected multiples or fractions, or both, of said magnitudes of said measurement voltages.

21. The system of claim 20 wherein said switching system is further capable of selectively electrically disconnecting from selected said word line and bit line end terminal regions other than said selected measurement ones thereof.

22. The system of claim 20 wherein none of said activation voltages provided at said selected word line and bit line end terminal regions other than said selected measurement ones have magnitudes that are greater than said switching voltage thresholds of said bit structures in said plurality thereof.

23. The system of claim 22 wherein none of said reference voltages provided at said selected word line and bit line end terminal regions other than said selected state change ones have magnitudes that are greater than said switching voltage thresholds of said bit structures in said plurality thereof.

24. The system of claim 22 wherein said selected activation voltages magnitude multiples include a multiple nearly equal to zero.

25. The system of claim 24 wherein those said selected activation voltages that are nearly zero, and that are provided to said selected word line and bit line end terminal regions other than said selected measurement ones, differ from being zero primarily due to voltage across a current sensing resistor electrically connected in series with each one of said selected word line and bit line end terminal regions other than said selected measurement ones to which such nearly zero activation voltages are provided.

26. The system of claim 16 wherein each of said plurality of ferromagnetic thin-film based bit structures is formed of a plurality of layers provided in a selected sequence therein comprising a memory film of an anisotropic ferromagnetic material capable of conducting an electrical current therethrough and an adjacent electrically insulative layer.

* * * * *

UNITED STATES PATENT AND TRADEMARK OFFICE
CERTIFICATE OF CORRECTION

PATENT NO. : 7,715,228 B2  Page 1 of 1
APPLICATION NO. : 12/229586
DATED : May 11, 2010
INVENTOR(S) : James G. Deak It is certified that error appears in the above-identified patent and that said Letters Patent is hereby corrected as shown below:

Col. 4, Line 9
Delete "baffler"
Insert --barrier--

Signed and Sealed this
Twenty-eighth Day of June, 2011

David J. Kappos
*Director of the United States Patent and Trademark Office*